United States Patent [19]
Kim et al.

[11] Patent Number: 5,838,895
[45] Date of Patent: Nov. 17, 1998

[54] FAULT DETECTION AND AUTOMATIC RECOVERY APPARATUS OR WRITE-READ POINTERS IN FIRST-IN FIRST-OUT

[75] Inventors: Seong-Do Kim; Hee-Bum Jung; Won-Chul Song, all of Daejeon, Rep. of Korea

[73] Assignees: Electronics and Telecommunications Research Institute, Daejeon; Korea Telecommunication Authority, Seoul, both of Rep. of Korea

[21] Appl. No.: 857,045

[22] Filed: May 15, 1997

[30] Foreign Application Priority Data

Dec. 11, 1996 [KR] Rep. of Korea ............... 1996 64192

[51] Int. Cl.[6] .............................. G06F 12/00; G06F 13/00
[52] U.S. Cl. .............................. 395/182.13; 395/183.18; 395/183.06; 711/100
[58] Field of Search ............... 395/182.13, 180, 395/185.06, 183.18; 365/221, 189.01; 711/100

[56] References Cited

U.S. PATENT DOCUMENTS

| | | | |
|---|---|---|---|
| 4,949,301 | 8/1990 | Joshi et al. | 711/100 |
| 5,046,000 | 9/1991 | Hsu | 711/100 |
| 5,404,332 | 4/1995 | Sato et al. | 361/201 |
| 5,426,756 | 6/1995 | Shyi et al. | 711/159 |

*Primary Examiner*—Ly Hua
*Attorney, Agent, or Firm*—Antonelli, Terry, Stout & Kraus, LLP

[57] ABSTRACT

The present invention relates to a fault detection and automatic recovery apparatus of write-read pointers in FIFO. While storing effective data in a register in writing performance, the apparatus does not unconditionally enable a FULL_FLAG signal allotted to the register but confirms the relation of write-read pointers at that time and the EMPTY_FLAG signal of a register at which the read pointer is situated and detects the error of FIFO. By selectively enabling the FULL_FLAG signal of the register according to the result of detection, it automatically restores the FIFO functions without unnecessary re-initialization or the discontinuation of data transmission attributable thereto.

5 Claims, 2 Drawing Sheets

FAULT DETECTION AND AUTOMATIC RECOVERY APPARATUS OR WRITE-READ POINTERS IN FIRST-IN FIRST-OUT

BACKGROUND OF THE INVENTION

1. Field of the Invention

The present invention relates to a FIFO (First-In First-Out) memory which is used to prevent a loss of data caused by asynchronism in data transmission between two systems operating at different frequencies. More particularly, this invention relates to a fault detection and automatic recovery apparatus of write-read pointers in FIFO memories.

2. Description of the Prior Art

Generally speaking, the FIFO is a kind of memory which is frequently used in data communication. Such a FIFO memory performs read or write sequentially along the previously fixed addresses unlike a memory element which can perform random access. In other words, it stores effective data in an optional register and then moves a write pointer to the previously fixed next address. In like manner, it also moves a read pointer to the previously fixed next address after the read pointer has read the effective data.

Since the FIFO can read after storing effective data in an empty space (register or memory cell), it characterizes that the read pointer follows the write pointer.

In the FIFO which accesses the previously fixed addresses sequentially, if and when effective data is stored in an optional register, other data cannot be overwritten before the effective data is accessed by reading, thus rendering initialization of read/write pointers to be very important. If the FIFO operates when the positions of initial read/write pointers are not the same like an instance where the read pointer precedes the write pointer or the write pointer precedes the read pointer owing to a failure in initialization, there is a serious data error. In other words, the data which is output through the FIFO is not kept in the order of the input data. Consequently, it loses the function of FIFO.

For example, as illustrated in FIG. 1, when all initial registers are empty, the read pointer is situated in the register at the address 1 due to a failure in initialization and the write pointer is normally situated in the register at the address 0 in the structure of FIFO in which 4 data can be stored, its performance will be observed. To help understand the performance, it is supposed that reading performance will begin after data is completely stored in all registers (4 registers).

Writing performance stores first data in the register at the address 0 according to the order of registers, then enables a FULL_FLAG_0 signal allotted to the address 0 and confirms the condition of the register at the address 1 which is the next address. Since no effective data has yet been stored in the register at the address 1, it stores second data therein. When the effective data is stored in 4 registers by repetitional writing performance, there exist no more empty registers, and so writing performance comes to a stop.

Regarding reading performance, the initial read pointer was situated at the address 1, so that the data of the register at the address 0 input firstly cannot be accessed first of all and the data will be accessed in the order of addresses 1, 2, 3 and 0. Consequently, the data which is output becomes different from the order of input data and the FIFO loses its function.

In this case, the FIFO is unable to return to normal conditions only with its existing structure. More particularly, if the read/write pointers are in such an abnormal condition in the UTOPIA interface which takes charge of interface between the physical layer of ATM, an applied field of the FIFO which processes frame-structured data, and ATM layer, it is next to impossible to expect normal data transmission. If necessary, the whole system must be initialized again and it is very inefficient.

Now, the distinction between the prior patent ("Apparatus for and a method of detecting a malfunction of a FIFO memory", U.S. Pat. No. 5,404,332) and the present invention will be clarified.

In the method of detecting a malfunction of a FIFO memory and restoring it to normalcy, the conventional parity check method cannot accurately detect an error when the error is not in the data but in the FIFO memory itself. Therefore, the prior patent realized the FIFO by means of a write address counter, a read address counter and a control counter to supplement its detection. The control counter used therein is to count the depth of a register containing effective data. Every time the write address counter changes, it is counted up. Conversely, it is counted down every time the read address counter changes. Therefore, when the FIFO is normal, the value of the control counter amounts to the number of registers containing the effective data.

So, in the prior patent, the error of the FIFO is detected in the condition where "write address count value-read address count value=control count value". In the present invention, however, the error of the FIFO is detected by confirming if the read pointer is at the "write pointer+1" address and the FULL_FLAG signal is at the "write pointer+1" address.

Moreover, in the prior patent, each counter is reset to restore the FIFO to normal conditions when an error is made. In the present invention, however, the FULL_FLAG signal of a corresponding register is selectively enabled according to the results of an error detector.

SUMMARY OF THE INVENTION

The object of the present invention is to provide a fault detection and automatic recovery apparatus of write-read pointers in FIFO memories which detect abnormal performance between a read pointer and a write pointer which may be caused by electrical noise and asynchronous initialization, and automatically restores its function without reinitialization.

In the FIFO memory which temporally stores data which is input when synchronized with a write clock and outputs the data in the order input by synchronizing it again with a read clock, a fault detection and automatic recovery apparatus of write-read pointers comprises: a write controller which selectively outputs a write control signal by receiving input of a write performance enable signal of FIFO input from the outside and an effective state signal of the present register of a write pointer; a first counter which outputs a carry signal which indicates that one cell is produced and a write low-ranking data pointer which is synchronized with the write clock and counts frame-structured low-ranking data when the write control signal output from the write controller is enabled; a second counter which is connected in series with the first counter and outputs a write cell pointer by counting the carry signal corresponding to one cell output from the first counter by being synchronized with the write clock only when the write control signal of the write controller is enabled; a write flag generator which disables an effective state signal of the present register of the write pointer corresponding to an enabled address among the read empty flag signals of each register group input from an outside reading processor and, upon receiving input of a signal resulting from a comparison made between the write-read pointers, outputs a state signal of the register corresponding to the write cell pointer output from the second counter by synchronizing it with the carry signal of the first counter and then enables it selectively; a first multiplexer, upon receiving input of the state signal of the register output from the write flag generator, selects and outputs only the state signal of the register corresponding to the write cell pointer; a second multiplexer which, upon receiving input of the state signal of the register output from the write flag generator, selects and outputs only the state signal of the register corresponding to the next address of the present write cell pointer output from the second counter; an analyzer of the write-read pointers which, upon receiving input of the read pointer input from the outside upon reading processor, the write cell pointer output from the second counter and the state signal of the register output from the second multiplexer, analyzes the relationship between the write-read pointers and outputs a signal resulting from a comparison made between the write-read pointers; a first decoder which decodes the signal of the write cell pointer output from the second counter according to the write control signal of the write controller and a second decoder which decodes the signal of the write low-ranking data pointer output from the first counter according to the write control signal of the write controller.

Additionally, the analyzer of write-read pointers determines the relation of read-write pointers to be abnormal when the read pointer input from the outside is situated at the next address register of the present write pointer and its register is in an empty condition.

Such an analyzer of write-read pointers comprises a third decoder which decodes the read cell pointer information input from the outside reading processor; a synchronizer which synchronizes the output of the third decoder with the write clock; a third multiplexer which receives input of the write cell pointer from the second counter and selects the output of the third decoder corresponding to the next address of the write pointer and a signal controller which receives input of the output from the third multiplexer and the output from the second multiplexer and controls a write requiring pointer signal.

The write flag generator enables a signal which shows that there is effective data in the register corresponding to the write cell pointer when the signal output from the analyzer of write-read pointers is normal. At the same time, the write flag generator disables the signal which shows that there is effective data in the register corresponding to the write cell pointer to restore normal FIFO functions if it stored the effective data in the register when the signal output from the analyzer of write-read pointers is abnormal.

In the present invention, a judgment of whether the relation between a write pointer and a read pointer is normal or abnormal can be formed by confirming the address of a register at which the write pointer and the read pointer are situated and a FULL_FLAG signal of the register.

In other words, write performance in a general FIFO memory stores effective data in the present register in which the write pointer is situated and then declares a FULL_FLAG signal allotted thereto. And, to ascertain if it can store data in a register at the next address, it confirms the state of that register. When the register is empty at this time, it stores new data therein but, when the effective data which is not yet read is contained therein, it is suspended to protect the existing data.

Therefore, when the write pointer and the read pointer are not situated in the same register and no effective data is contained in the register of the read pointer, the relation between the write-read pointers within the FIFO can be judged to be abnormal.

DESCRIPTION OF PREFERRED EMBODIMENTS

Figure 2:
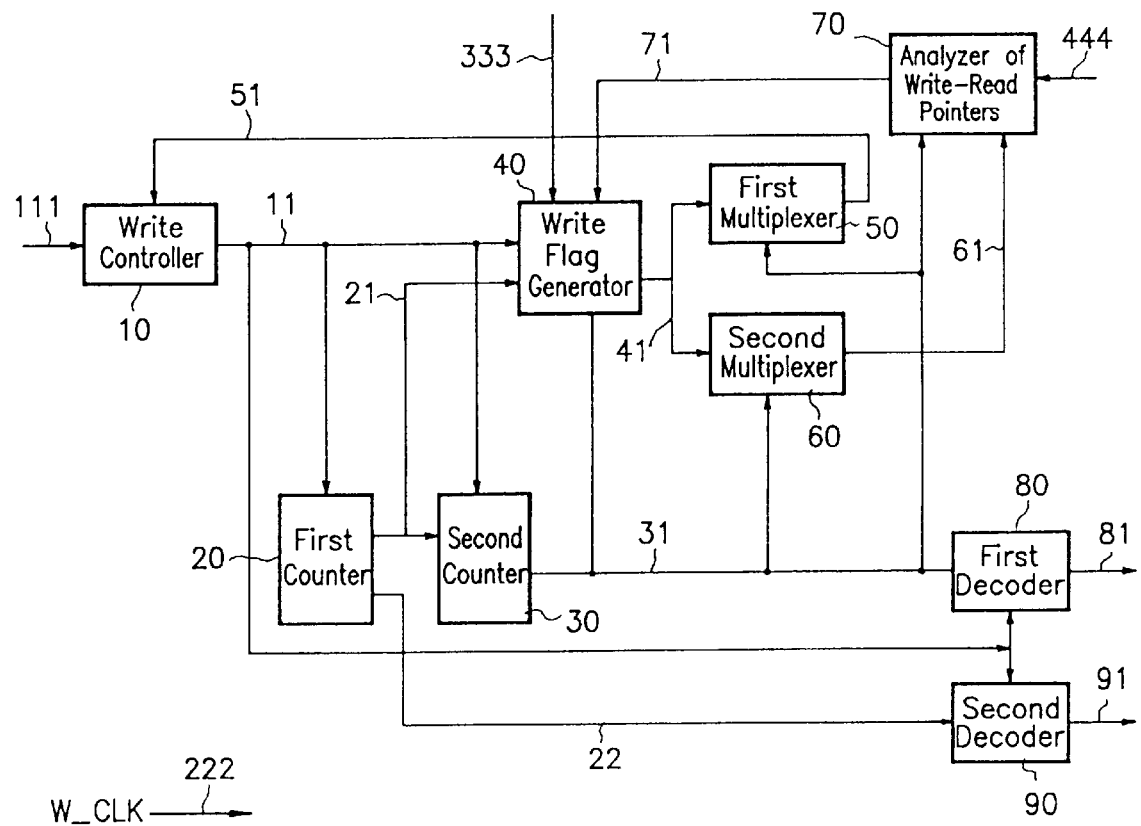
FIG. 2 is a block diagram of a fault detection and automation recovery apparatus of a FIFO according to the present invention.

FIG. 2 is a schematic diagram of an apparatus which detects the abnormal relation of write-read pointers and automatically recovers FIFO functions.

The fault detection and automatic recovery apparatus of write-read pointers in FIFO comprises a write controller (10), a first counter (20), a second counter (30), a write flag generator (40), a first multiplexer (50), a second multiplexer (60), an analyzer (70) of write-read pointers, a first decoder (80) and a second decoder (90).

The write controller (10) receives input of a WRITE_ENABLE signal (111) which controls the write performance of the FIFO and is input from the outside and an effective state signal (W_FULL_FLAG) (50) of the present register of the write pointer which is output from the first multiplexer (50), and outputs a write control signal (W_EN_INT) (11) selectively according to the input conditions of the two signals.

The first counter (W_UNIT_PTR_COUNTER) (20) is driven by being synchronized with a write clock (W_CLK) (222) when the write control signal (W_EN_INT) (11) output from the write controller (10) is enabled. The first counter (20) has a frame size (for example, in the case of ATM cell which is a basic cell for SDH transmission system, it is formed of 53 bytes, and so the size of a frame is "53".) when the data which is input to the FIFO has a frame structure. According thereto, the first counter (20) outputs a carry signal (W_UNIT_CARRY) (21) which indicates that one cell is produced and a write low-ranking data pointer (W_UNIT_PRT[m:1]) (22) by being synchronized with the above write clock (222) and counting the frame-structured 53 bytes (forms one cell) sequentially.

The second counter (W_CELL_PTR_COUNTER) (30) is connected in series to the first counter (W_UNIT_PTR_COUNTER) (20). The second counter outputs a write cell pointer (W_CELL_PRT[n:1]) (31) by being synchronized with the write clock (W_CLK) (222) and counts the carry signal (W_UNIT CARRY) (21) which indicates that one cell output from the above first counter (20) is produced only when the write signal (W_EN_INT) (11) output from the above write controller (10) is enabled. Such second counter (30) is related to the register depth of the FIFO.

The write flag (W_FULL_FLAG) generator (40) receives input of read empty flag (R_EMPTY_FLAG) signals [2"] (333) which show if each register group reads its registers from the outside reading processor. The write flag generator (40) disables an effective state (W_FULL_FLAG) signal of the present register of the write pointer corresponding to an enabled address among the input R_EMPTY_FLAG signals. Moreover, the write flag generator (40) synchronizes the state (W_FULL_FLAG) signal (41) of a register corresponding to the write cell pointer (W_CELL_PTR[n:1]) (31) output from the above second counter (W_CELL_PTR_COUNTER) (30) with the W_UNIT_CARRY signal (21) output from the above first counter (20) and selectively enables it and then outputs it according to the state of a signal resulting from a comparison made between write-read pointers (WR_EQ_PTR) (71) output from the analyzer (70) of write-read pointers (WR_PTR) which will be described hereinafter. Such a write flag generator (40) enables and outputs the W_FULL_FLAG signal which shows that an effective data is contained only when the relation between write-read pointers is proved to be normal if it stored all data of one frame as a group of registers.

The first multiplexer (W_FULL_FLAG) (50) receives input of the state signal (W_FULL_FLAG)[$2^n$] (41) of the register output from the above write flag generator (40) and selects only the state signal (W_FULL-FLAG) of the register corresponding to the write cell pointer (W_CELL_PTR[n:1] (31) output from the above second counter (W_CELL_PTR_COUNTER) (30) and outputs it.

The second multiplexer (W_FULL_FLAG_NEXT) (60) receives input of the state signal (W_FULL_FLAG) [$2^n$] (41) of the register output from the above write flag generator (40) and selects only the state (W_FULL_FLAG_NEXT) signal (61) of the register corresponding to the next address of the present write cell pointer (W_CELL_PTR[n:1] (31) output from the above second counter (30) and outputs it.

The analyzer (70) of write-read pointers (WR_PTR) receives input of the read pointer information (R_CELL_PTR[n:1]) (444) output from the outside reading processor, input of the write cell pointer (W_CELL_PTR[n:1] (31) output from the second counter (W_$_{CELL}$_PTR_COUNTER) (30) and input of the state signal (W_FULL_FLAG_NEXT) (61) and analyzes the relation between write-read pointers and outputs a signal resulting from a comparison made between the write-read pointers (WR_EQ_PTR) (71).

The first decoder (W_CELL_PTR) (80) receives input of the write cell pointer (W_CELL_PTR[n:1] signal (31) output from the above second counter (W_CELL_PTR_COUNTER) (30), and decodes it only when the write control signal (W_EN_INT) (11) is enabled and then outputs (W_CELL_PTR_DEC) [$2^n$] (81) it.

The second decoder (W_UNIT_PTR) (90) recovers input of the signal of the write low-ranking data pointer (W_UNIT_PTR[m:1]) (22) output from the above first counter (W_UNIT_PTR_COUNTER) (20) and decodes it only when the write control signal (W_EN_INT) (11) output from the above write controller (10) is enabled and then outputs (W_UNIT_PTR_DEC) [$2^n$] (91) it.

Performance and effectiveness of the fault detection and automatic recovery apparatus of write-read pointers in FIFO formed in such a manner will now be described.

The write controller (10) is formed so as to limit writing performance in order to protect the existing effective data contained in FIFO even if writing performance is enabled from the outside.

In other words, if and when an effective data which has not yet been read is contained in a register at which the write pointer is located, the write controller (10) disables the W_EN_INT (11) signal to protect the existing effective data contained in the register even if the input WRITE_ENABLE (111) signal is enabled. Whether effective data is contained or not can be judged by confirming the W_FULL_FLAG signal of the register at which the write pointer is situated. The first multiplexer (W_FULL_FLAG) (50) selects and provides the W_FULL_FLAG signal of the register at which the write pointer is situated.

A FIFO according to the present invention has two counters for generation of pointers to process frame-structured data.

One is a counter which has the size of a frame to process frame-structured low-ranking data.

The other is a counter which shows the number of frames the FIFO can accommodate.

As illustrated in FIG. 2, the first counter (W_UNIT_PTR_COUNTER) (20) is a device to process low-ranking data in frame structure and the second counter (W_CELL_PTR_COUNTER) (30) is a device to show the number of frames the FIFO can accommodate.

The second counter (30) and the first counter (20) operate by being connected in series.

In other words, the second counter (30) which shows the number of frames the FIFO can accommodate receives input of the carry signal (W_UNIT_CARRY) (21) from the first counter (20) and operates only when the write control signal (W_EN_INT) (11) is enabled.

The number of write flags which shows the state of FIFO depends on the second counter (W_CELL_PTR_COUNTER)(30). That is, the write flag (W_FULL_FLAG) is not allotted to every low-ranking data included in the frame. It is allotted to the frame as a unit.

The write flag generator (40) is a device which generates a signal which indicates that effective data is contained in the register of FIFO. When the write control signal (W_EN_INT) (11) is enabled, it begins to write data in the register group indicated by the write cell pointer (W_CELL_PTR [n:1]) and writes the last data included in the frame. At the same time, it selectively enables the write flag (W_FULL_FLAG) signal indicated by the write cell pointer (W_CELL_PTR [n:1]) according to the output (WR_EQ_PTR)(71) value of the analyzer (70) of write-read pointers (WR_PTR).

In other words, even if the write flag generator stored all data of one frame in the register group, it enables the write flag (W_FULL_FLAG) signal which shows that an effective data is contained only when the relation of write-read pointers at that time is proved to be normal.

The write flag generator (40) receives input of R_EMPTY_FLAG signals (333) which indicate if each register group reads its registers from the outside reading processor (not illustrated) and disables the write flag (W_FULL_FLAG) signal of a corresponding register group by synchronizing it with the W_CLR (222).

The analyzer of write-read pointers (WR_PTR)(70) is a device which analyzes the present relation between write-read pointers.

Figure 3:
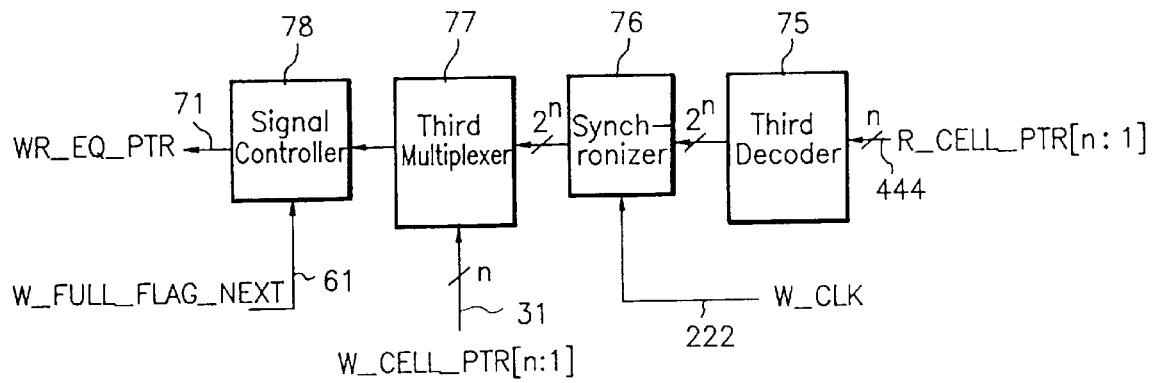
FIG. 3 is a detailed schematic diagram showing the inner part of an analyzer of write-read pointers illustrated in FIG. 2.

As illustrated in FIG. 3, the present invention comprises a third decoder (75) which receives a read pointer (R_CELL_PTR[n:1]) (444) from the reading processor (not illustrated) and decodes it; a synchronizer (76) which synchronizes output of the above third decoder (75); a third multiplexer (77) which receives input of the write cell pointer (W_CELL_PTR_COUNTER)(30) and selects output of the third decoder (75) corresponding to the next address of write pointer and a signal controller (78) which controls a value resulting from a comparison made between write-read pointers (WR_EQ_PTR)(71) with output of the above third multiplexer (77) and a W_FULL_FLAG_NEXT (61) signal output from the second multiplexer as input.

Thus, the analyzer (70) of write-read pointers (WR_PTR) receives input of read pointer information (R_CELL_PTR [n:1]) (444) from the reading processor (not illustrated) and judges if the read pointer is situated at the next address of the write pointer. It also receives input of the information (W_FULL_FLAG_NEXT) (61) which shows the state of a register at the next address of the write pointer from the second multiplexer (W_FULL_FLAG_NEXT) (60) and judges the relation between the write-read pointers. In other words, it judges the relation between the write-read pointers to be abnormal only when the read pointer is situated at the next address of the present write pointer and its register is empty, and enables the result of a comparison made between the write-read pointers (WR_EQ_PTR)(71).

According thereto, the above write flag (W_FULL_FLAG) generator (40) disables the write flag state (W_FULL_FLAG) even if it stored effective data in the present register group, if its WR_EQ_PTR (71) signal is enabled. So, the effective data of one frame is lost but it is restored to normal FIFO functions in the final analysis.

On the contrary, when the existing FIFO finishes storing effective data in a register or a register group, it unconditionally enables the W_FULL_FLAG, which is information that the effective data is contained, without confirming the position of a read pointer and the state of a corresponding register. So, if the write-read pointers of FIFO operated in an abnormal condition, first-in first-out functions will be lost, as described hereinabove.

However, the FIFO according to the present invention enables the W_FULL_FLAG signal selectively by analyzing the position of read pointer and the state of a corresponding register while storing the effective data in the corresponding register.

In other words, if and when the FIFO confirms that the relation between the write-read pointers is normal, it enables the W_FULL_FLAG signal, but it does not enable the W_FULL_FLAG signal to restore normal functions even if it stored effective data in a register, if it confirms that the relation between the write-read pointers is abnormal.

Consequently, this register is overwritten by the next writing performance and data is lost, but it will restore normal first-in first-out functions in the final analysis.

One embodiment of the present invention will now be described on the basis of a FIFO comprised of 4registers.

Figure 1:
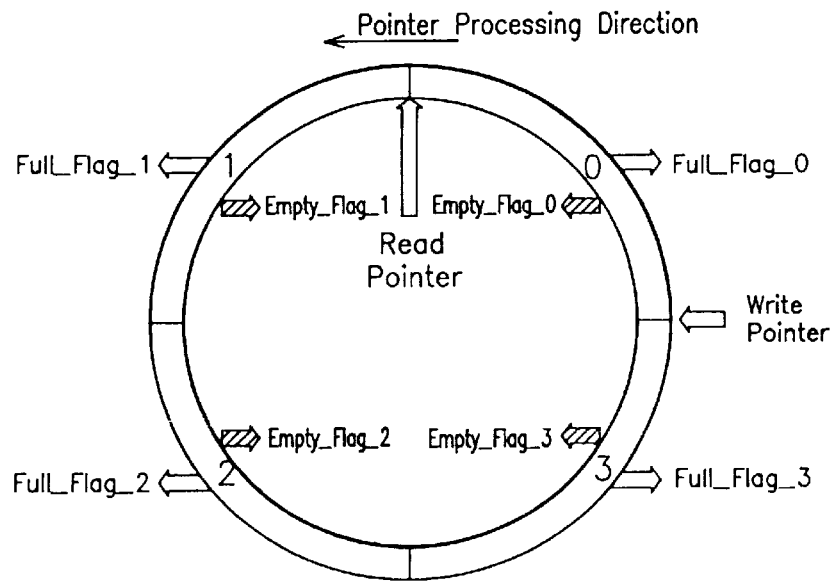
FIG. 1 is a diagram illustrating FIFO performance in an abnormal condition of write-read pointers.

Looking at the state of the initial write-read pointers in FIG. 1, the write pointer is situated at the address 0, the read pointer is situated at the address 1 corresponding to the next address of the write pointer and the FULL_FLAG signal of each register in the initial stage is disabled, so that the analyzer (70) of the write-read pointers (WR_PTR) judges that the relation between the present write-read pointers is abnormal and enables the WR_EQ_PTR (71) signal. So, it stores a first input data in the register at the address 0 by writing performance but disables the FULL_FLAG_0.

Looking at the relation between the write-read pointers at this time, the read pointer moves to the next address and then indicates the address 1 and the read pointer indicates the address 1 as it is without a change, and so it is not in the abnormal state of write-read pointers. Accordingly, the analyzer (70) of write-read pointers disables the WR_EQ_PTR (71) signal, and stores a second input data in the register at the address 1 by performing writing and enables a FULL_FLAG_1 signal.

By repeated writing performance, the analyzer (70) stores input data in those registers at the addresses 2 and 3 and enables a FULL_FLAG_2 signal and a FULL_FLAG_3 signal.

Finishing off storing input data in the register at the address 3, the analyzer (70) confirms a FULL_FLAG_0 of the register at the address 0. Though the first input effective data is actually stored in the register at the address 0, FIFO is operated in the abnormal state of write-read pointers, so that the FULL_FLAG_0 signal has been disabled. So, the register at the address 0 is overwritten by newly input data and there are no more empty registers. For this reason, writing performance is discontinued.

On the other hand, the analyzer (70) reads data stored in the registers by reading performance beginning with the register at the address 1. Consequently, as shown in FIG. 1, when accessing of 4 registers is finished, the abnormal state of write-read pointers in the initial stage is restored to the normal state.

Figure 4:
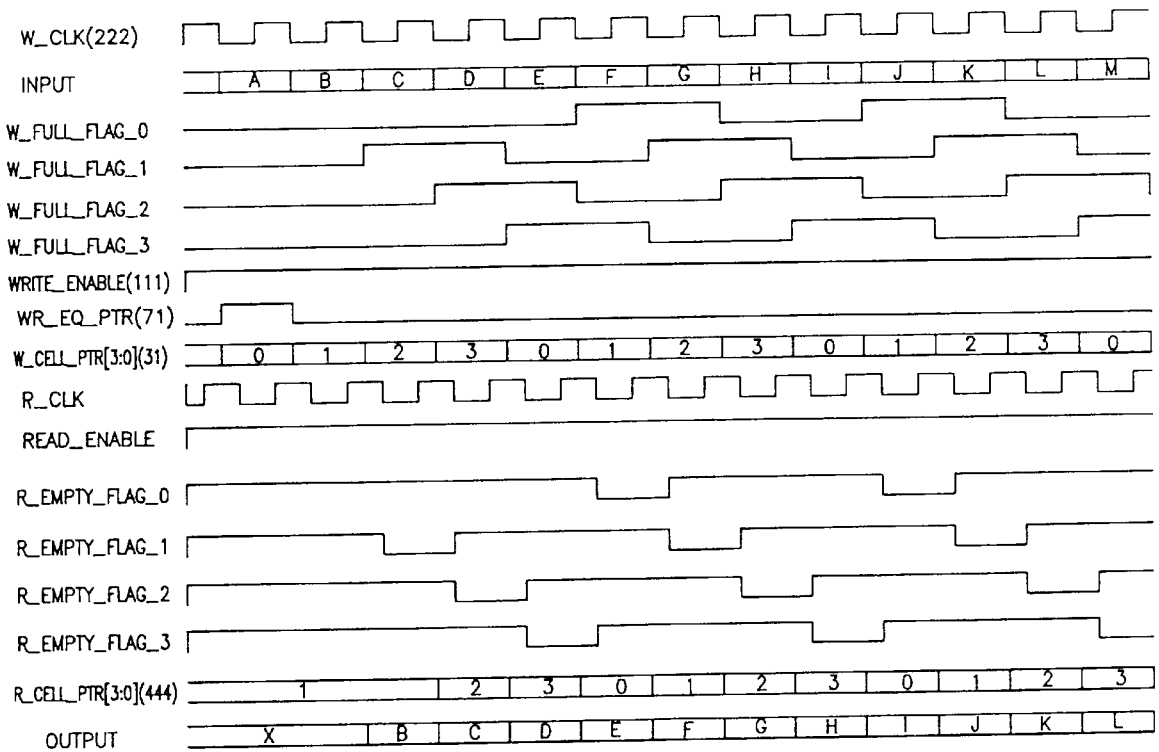
FIG. 4 is a timing diagram illustrating fault detection and automatic recovery functions of write-read pointers according to the present invention.

FIG. 4 relates to a performance of a FIFO comprised of 4 registers according to the invention. It illustrates the relation between the state signal and the input/output data of each register.

As described hereinabove, the present invention is formed so as to analyze the position of a read pointer and the state of a corresponding register and enable a FULL_FLAG signal selectively according to the result thereof. Therefore, even when the FIFO operates in the abnormal state of write-read pointers due to failure in initialization or owing to an electric shock, it recovers normal functions in the final analysis without discontinuation of data transmission caused by unnecessary re-initialization, though a small loss is inflicted on data in the initial stage.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. In a FIFO memory which temporally stores data which is input when synchronized with a write clock and outputs the data in the order input therein when synchronized with a read clock, a fault detection and automatic recovery apparatus of write-read pointers comprises:

a write controller which receives input of a write performance enable signal of FIFO input from the outside and an effective state signal of the present register of a write pointer and selectively outputs a write control signal;

a first counter which outputs a carry signal which indicates that one cell is produced and a write low-ranking data pointer when synchronized with the write clock and counts frame-structured low-ranking data when the write control signal output from the above write controller is enabled;

a second counter which is connected in series with the first counter and outputs a write cell pointer when synchronized with said write clock and counts the carry signal corresponding to one cell output from the above first counter only when said write control signal of said write controller is enabled;

a write flag generator which disables an effective state signal of the present register of a write pointer corresponding to an enabled address among the write empty flag signals of each register group input from an outside reading processor and, upon receiving input of a signal resulting from a comparison made between write-read pointers, outputs an effective state signal of a register corresponding to the write cell pointer output from the second counter by synchronizing said effective state signal with the carry signal of said first counter and then enabling said effective state signal selectively;

a first multiplexer which, upon receiving input of the state signal of the register output from said write flag generator, selects and outputs only the state signal of a register corresponding to the write cell pointer output from said second counter;

a second multiplexer which, upon receiving input of the state signal of the register output from said write generator, selects and outputs only the state signal of the register corresponding to the next address of the present write cell pointer output from said second counter;

an analyzer of write-read pointers which, upon receiving input of said read pointer input from the outside reading processor, said write cell pointer output from said second counter and the state signal of the register output from said second multiplexer, outputs a signal resulting from a comparison made between write-read pointer by analyzing the relation of write-read pointers;

a first decoder which decodes the signal of the write cell pointer output from said second counter according to the write control signal output from said write controller; and a second decoder which decodes the signal of the write low-ranking data pointer output from said first counter.

2. The fault detection and automatic recovery apparatus of write-read pointers as set forth in claim 1, wherein said analyzer of write-read pointers determines that the relation of the write-read pointers is abnormal only when it is located at the next address of the present write pointer input from the outside and the register thereof is empty.

3. The fault detection and automatic recovery apparatus of write-read pointers as set forth in claim 1, wherein said analyzer of write-read pointers comprises:

a third decoder which decodes the read cell pointer information input from the outside reading processor;

a synchronizer which synchronizes the output of said third decoder with said write clock;

a third multiplexer which, upon receiving input of the write cell pointer from said second counter, selects the output of said third decoder corresponding to the next address of write pointer; and a signal controller which, upon receiving input of the output of said third multiplexer and the output of the above second multiplexer, controls said write requiring pointer signal.

4. The fault detection and automatic recovery apparatus of write-read pointers as set forth in claim 1, wherein said write flag generator enables a signal indicating that effective data is contained in the register corresponding to said write cell pointer when the signal output from the above analyzer of write-read pointers is normal.

5. The fault detection and automatic recovery apparatus of write-read pointers as set forth in claim 1, wherein said write flag generator disables the signal which shows that effective data is contained in the register corresponding to said write cell pointer to restore normal FIFO functions if it stored the effective data in the register to restore normal FIFO functions when the signal output from said analyzer of write-read pointers is abnormal.

* * * * *